US008219951B2

(12) United States Patent
Cheng et al.

(10) Patent No.: US 8,219,951 B2
(45) Date of Patent: Jul. 10, 2012

(54) METHOD OF THERMAL DENSITY OPTIMIZATION FOR DEVICE AND PROCESS ENHANCEMENT

(75) Inventors: Ying-Chou Cheng, Zhubei (TW); Tsong-Hua Ou, Taipei (TW); Chih-Wei Hsu, Zhubei (TW); Cheng-Lung Tsai, Hsin-Chu (TW); Ru-Gun Liu, Hsinchu (TW); Wen-Chun Huang, Tainan County (TW); Boren Luo, Zhubei (TW)

(73) Assignee: Taiwan Semiconductor Manufactuing Company, Ltd., Hsin-Chu (TW)

( * ) Notice: Subject to any disclaimer, the term of this patent is extended or adjusted under 35 U.S.C. 154(b) by 160 days.

(21) Appl. No.: 12/713,902

(22) Filed: Feb. 26, 2010

(65) Prior Publication Data

US 2011/0214101 A1 Sep. 1, 2011

(51) Int. Cl.
*G06F 17/50* (2006.01)
(52) U.S. Cl. ...................................................... 716/110
(58) Field of Classification Search ................... 716/100, 716/110
See application file for complete search history.

(56) References Cited

U.S. PATENT DOCUMENTS

| 2008/0162103 | A1* | 7/2008 | White et al. .................... 703/13 |
| 2010/0019329 | A1* | 1/2010 | Poon et al. .................... 257/390 |
| 2011/0066270 | A1* | 3/2011 | Ju et al. ......................... 700/103 |
| 2011/0204470 | A1* | 8/2011 | Cheng et al. .................. 257/499 |
| 2011/0289470 | A1* | 11/2011 | Bickford et al. .............. 716/132 |

OTHER PUBLICATIONS

Unpublished U.S. Appl. No. 13/227,118, filed Sep. 7, 2011, entitled "Target Based Dummy Insertion for Semiconductor Devices," 5 pages.

* cited by examiner

*Primary Examiner* — Suchin Parihar
(74) *Attorney, Agent, or Firm* — Haynes and Boone, LLP

(57) ABSTRACT

The present disclosure provides an integrated circuit method. The method includes providing an integrated circuit (IC) design layout; simulating thermal effect to the IC design layout; simulating electrical performance to the IC design layout based on the simulating thermal effect; and performing thermal dummy insertion to the IC design layout based on the simulating electrical performance.

20 Claims, 12 Drawing Sheets

290

| n, k | | Flash<br>510nm | RTA<br>1000nm | Laser<br>10600nm |
|---|---|---|---|---|
| ▬▬ | Si₃N₄ | (2, 0) | (2, 0) | (2, 0) |
| ▬▬ | Poly-Si | (4.20, 0.123) | (3.53, 0) | (3.379, 0) |
| ▬▬ | SiO₂ | (1.46, 0) | (1.45, 0) | (2, 1.38) |
| ▬▬ | Si | (4.24, 0.0665) | (3.6, 0.0004) | (3.42, 0.0000676) |

Fig. 5

METHOD OF THERMAL DENSITY OPTIMIZATION FOR DEVICE AND PROCESS ENHANCEMENT

BACKGROUND

A semiconductor wafer is processed in a semiconductor manufacturer to form various integrated circuits (IC) in different regions of the wafer. The integrated circuit formed on the semiconductor substrate includes a plurality of semiconductor devices. Various semiconductor manufacturing processes are employed to form the semiconductor devices, including etching, lithography, ion implantation, thin film deposition, and thermal annealing. However, in current fabrication methods to form an integrated circuit, a thermal annealing process applied to a semiconductor wafer introduces non-uniformity in the performance of the semiconductor devices. The electrical performance varies from device to device formed on the semiconductor wafer, degrading the overall quality of the integrated circuit. When semiconductor process technology progresses to advanced technology nodes, such as 65 nm, 45 nm, or 30 nm and below, the issue is more severe. Therefore, there is a need for an integrated circuit structure and method of making the same to address this issue.

SUMMARY

The present disclosure provides one embodiment of an integrated circuit method. The method includes providing an integrated circuit (IC) design layout; simulating thermal effect to the IC design layout; simulating electrical performance to the IC design layout based on the simulating thermal effect; and performing thermal dummy insertion to the IC design layout based on the simulating electrical performance.

The present disclosure also includes another embodiment of an integrated circuit method. The method includes providing a plurality of test patterns; collecting thermal data of the test patterns; building up a thermal model based on the thermal data; and adding thermal dummy features to an integrated circuit (IC) design using the thermal model.

The present disclosure also includes another embodiment of an integrated circuit method. The method includes providing a plurality of test patterns; collecting thermal data of the test patterns; creating a look-up table based on the thermal data; evaluating thermal effect to an integrated circuit (IC) design; adding thermal dummy features to the IC design using the look-up table; and thereafter making a mask according to the IC design.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 is a chart providing various optical parameters for different materials used in a semiconductor wafer.

DETAILED DESCRIPTION

Figure 1:
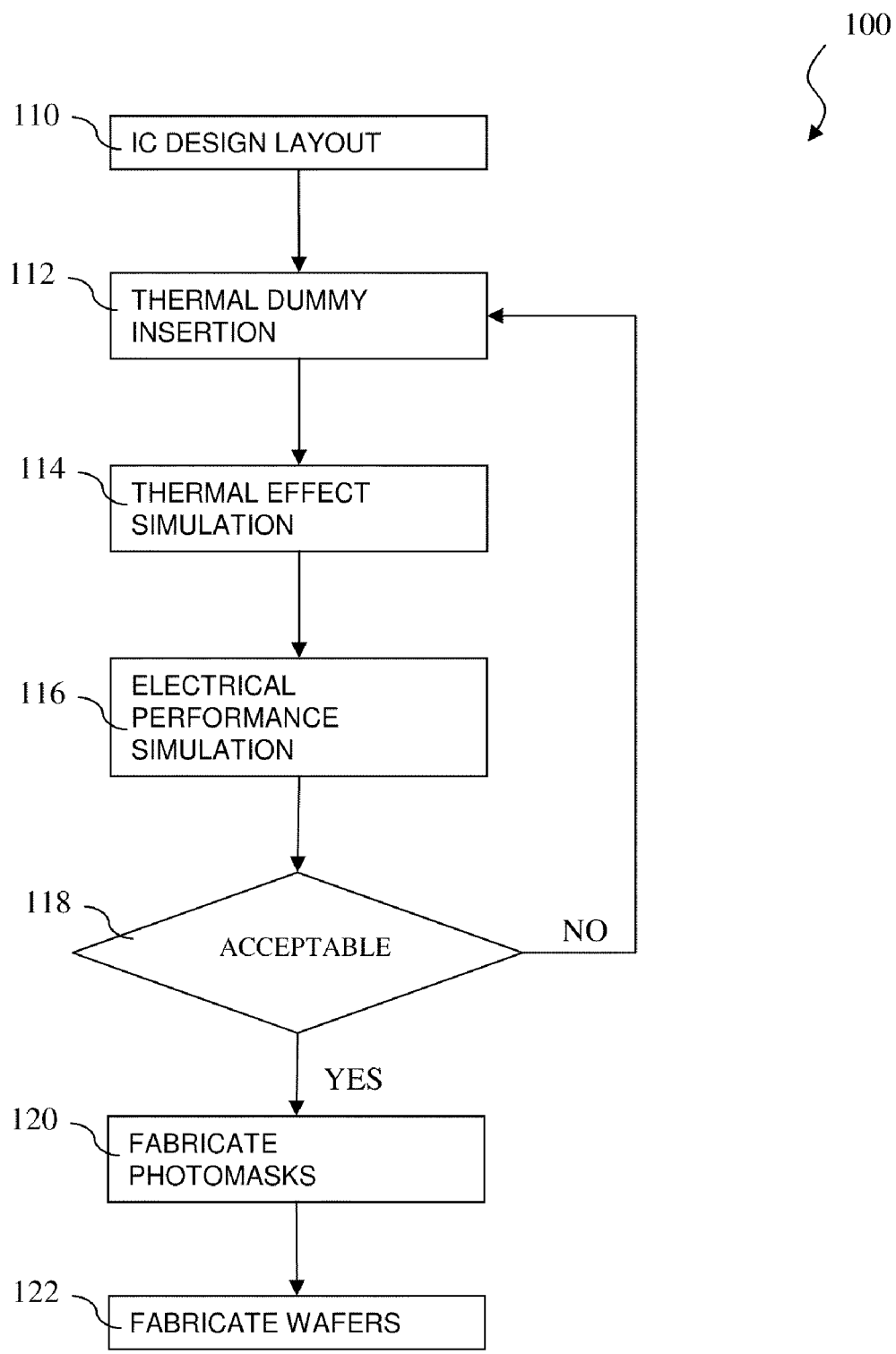
FIG. 1 is a flowchart of an integrated circuit (IC) design method constructed according to aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
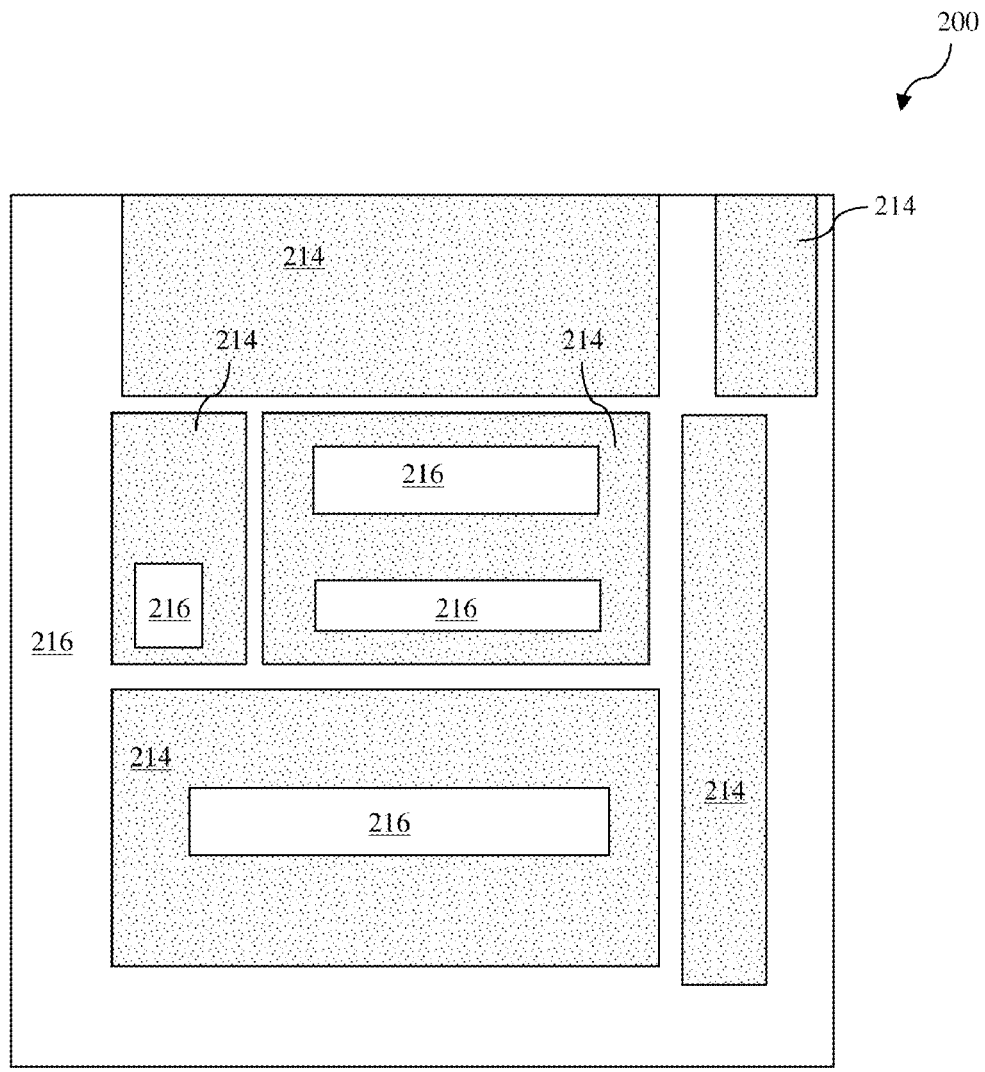
FIG. 2 is a top view of an IC design layout constructed according to aspects of the present disclosure in one embodiment.

FIG. 1 is a flowchart of an integrated circuit design method 100 constructed according to aspects of the present disclosure in one embodiment. FIG. 2 is a top view of an integrated circuit design layout 200 constructed according to aspects of the present disclosure in one embodiment. The IC design method 100 and the IC design layout 200 are collectively described with reference to FIGS. 1 and 2. The method begins at step 110 by providing an integrated circuit (IC) design. The IC design may include one or more IC design layouts designed to be formed on a respective photomask and further to be formed on respective material layers of a wafer. For example, an IC design includes a first IC design layout for shallow trench isolation, a second IC design layout for transistor gates, and a third IC design layout for source/drain. The IC design layout 200 is illustrated in FIG. 2 as a representative example. The IC design layout 200 includes various circuit patterns 214, also referred to as main patterns. Various circuit features are defined in the main patterns 214. The IC design layout 200 also includes various dummy regions 216. In the semiconductor design and fabrication flow, the IC design layout is transferred to a mask using an electron beam, ion beam or other suitable technique. One or more wafers are then patterned during a lithography process using the mask such that the mask pattern is transferred to a material layer of the wafers. The IC design and IC design layout are interchangeably used in the following description.

The circuit patterns 214 include various circuit features (not shown in FIG. 2). In various examples, the circuit patterns include polysilicon gates, shallow trench isolation (STI) features, lightly doped drain (LDD) regions, doped wells, contacts, vias, metal lines, or other patterned features to be formed on a wafer. Since the pattern density is usually not uniformly distributed, it may cause fabrication variation when the circuit patterns are transferred to the wafer. For example, a chemical mechanic polishing (CMP) process is applied to a wafer to achieve a global planarizing surface. However, when the circuit patterns, such as STI features or metal lines, are not uniformly distributed, the global planarizing effect to the wafer is reduced or degraded. Therefore, dummy insertion is applied to the IC design layout for optimized CMP effect. In another example, various sub-resolution assistant features are incorporated into the IC design layout to achieve the optimized imaging effect when the circuit patterns are transferred from the mask to the wafer.

In wafer fabrication, a thermal annealing process is implemented at various stages, such as an activation annealing process to reduce defects and activate the doped species after an ion implantation process. However, when thermal effect is not globally uniform across the wafer, the annealing effect varies from location to location on the wafer, causing the circuit to exhibit electrical performance variation over the locations. For example, when the annealing temperature is below or above the expected annealing temperature within a local circuit environment, the threshold voltage and the saturation current of a field-effect transistor (FET) can be out of specification due to under-dose or overdose annealing. The present disclosure provides an IC design structure having circuits patterns and dummy thermal features to accomplish a uniform annealing effect. The present disclosure also provides a method of incorporating dummy thermal features into the IC design layout 200 for optimized circuit performance. The dummy thermal features are dummy features inserted in the circuit pattern for thermal effect but are not electrically coupled to the functional circuit and do not have any direct electrical function to the circuit. Therefore, those features are referred to as dummy thermal features. Similar to dummy CMP features or optical assist features, the dummy thermal features are incorporated into an IC design layout prior to the masking fabrication. The dummy thermal features are different from the optical assist features since the optical assist features are sub-resolution features. The dummy thermal features are not sub-resolution features. The dummy thermal features are added to the IC design, transferred to a mask, and further transferred to a wafer in order to contribute to the thermal annealing process applied to the wafer. If the IC design layout is for STI, then the dummy thermal features to be incorporated into the IC design layout are STI as well. If the IC design layout is for polysilicon gates, then the dummy thermal features to be incorporated into the IC design layout are polysilicon gates as well.

The method 100 proceeds to step 112 by performing a thermal dummy insertion to the IC design layout 200 and to step 114 by evaluating the thermal effect of the main circuit features during an annealing process. A dummy thermal feature can be formed adjacent the main circuit features, such as in a dummy region 216 as shown in FIG. 2. The dummy thermal feature can be designed in any proper shape, size, and location. In one example, the dummy thermal feature has a rectangular shape. In another example, the dummy thermal feature is aligned with an adjacent main circuit feature. In another example, the dummy thermal feature is added based on a simulation model (for example, after evaluating the thermal effect of the main circuit features in the IC design layout during an annealing process). Since the dummy thermal features are added to the IC design to achieve uniform annealing effect during an annealing process, the simulation model is associated with a corresponding annealing mechanism of the annealing process. The steps 112 and 114 are collectively discussed in detail with various examples and further references to FIGS. 3 through 6.

Figure 3A:
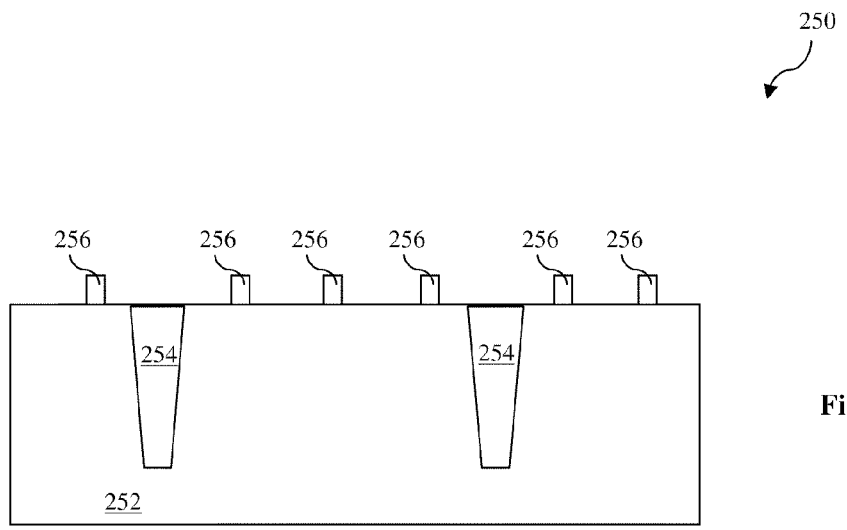
FIGS. 3a and 3b are sectional views of a semiconductor structure constructed according to aspects of the present disclosure in various embodiments.
Figure 3B:
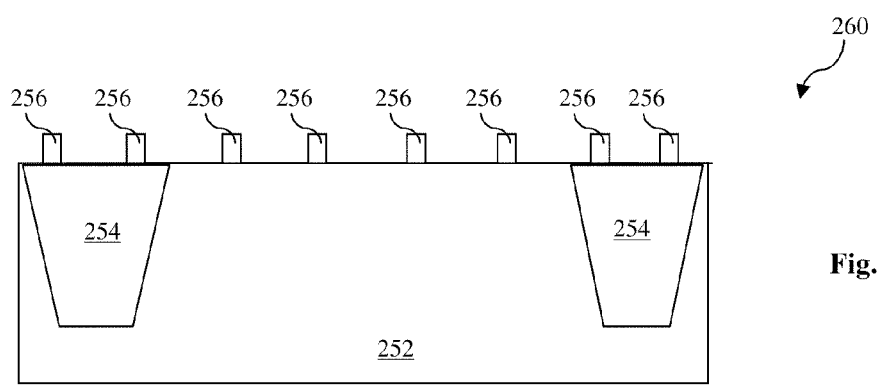

In one particular example, the IC design layout 200 is a designed pattern for shallow trench isolation (STI) features 254 to be formed in a semiconductor wafer, such as those shown in FIG. 3A, a sectional view of a semiconductor structure 250, and those shown in FIG. 3b, a sectional view of another semiconductor structure 260. The semiconductor structure 250 (or 260) is a portion of a semiconductor wafer, or particularly a portion of a semiconductor die (or a chip). The semiconductor structure 250 (or 260) includes various devices (not shown), such as active devices and/or passive devices. The active devices include transistors, such as a field effect transistor (FET). In one embodiment, the field effect transistor is a metal-oxide-semiconductor (MOS) field effect transistor. In another embodiment, the various devices include memory devices, such as static random access memory (SRAM) cells. A SRAM cell includes various capacitors and transistors configured and coupled to be functional for data storage and access.

The semiconductor structure 250 (or 260) includes a semiconductor substrate 252. In one embodiment, the semiconductor substrate includes silicon. Alternatively, the substrate 252 includes germanium or silicon germanium. In other embodiments, the substrate 252 may use another semiconductor material, such as diamond, silicon carbide, gallium arsenic, GaAsP, AlInAs, AlGaAs, GaInP, or other proper combination thereof. Furthermore, the semiconductor substrate 252 may include a bulk semiconductor, such as bulk silicon, and an epitaxy silicon layer formed on the bulk silicon.

The STI features formed in the semiconductor substrate 252 are designed for isolation. Alternatively, other suitable isolation features such as local oxidation of silicon (LOCOS) may be employed. The STI features define various active regions where the semiconductor substrate 252 is uncovered by the isolation features. Various doping features and active devices can be formed in the active regions.

The semiconductor structure 250 (or 260) further includes various gates 256 disposed on the substrate 252, as illustrated in FIGS. 3A and 3B. Each gate includes a gate dielectric (material) and a gate electrode disposed on the gate dielectric. In various embodiments, the gate dielectric includes silicon oxide, high-k dielectric material, or combinations thereof. The gate electrode includes doped polysilicon, metal, or combinations thereof. A pair of source and drain may be further formed in the substrate and interposed by the gate to form a functional field effect transistor. Alternatively, a gate may be disposed on the isolation feature as a dummy feature for fabrication purposes, such as CMP process uniformity or optical proximity correction (OPC) effect.

The manufacturing processes to form the semiconductor structure 100 include various thermal annealing steps that include, but are not limited to, thermal annealing to form STIs and thermal annealing applied to the semiconductor substrate after an ion implantation process. It has been identified in experiments that a thermal annealing process can generate different thermal effect in various local environments of the semiconductor wafer due to pattern characteristics. Particularly, when a laser spike anneal (LSA) is used for the thermal annealing process after an ion implantation process, the corresponding annealing effect variation was identified with significant impact to the circuit quality and electrical performance. The LSA is a thermal annealing tool employing laser energy for thermal annealing effect. The LSA provides very rapid annealing, such as in millisecond or microsecond.

Figure 4:
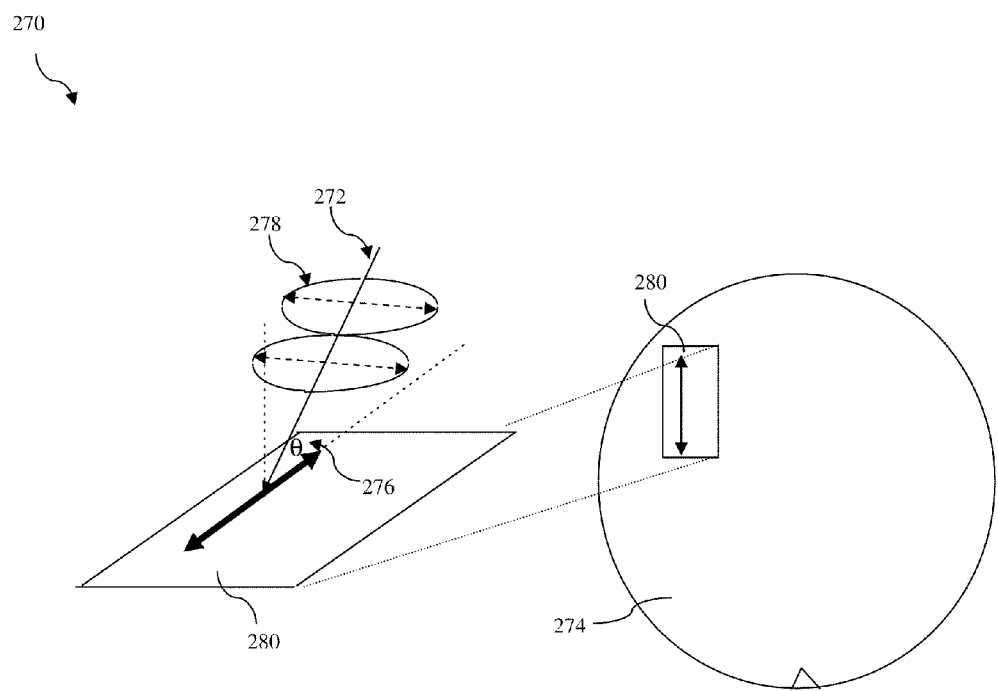
FIG. 4 is a schematic diagram illustrating laser spike annealing constructed according to aspects of the present disclosure in one embodiment.

Referring to FIG. 4, one example of a LSA system 270 developed by Ultratech, Inc., North America, 4 Constitution Way, Suite L, Woburn, Mass. 01801. The LSA system 270 includes carbon dioxide ($CO_2$) gas used to generate laser with a wavelength at about 10.6 micrometers. In one application, when the laser beam 272 from the LSA system 270 is directed to the surface of a semiconductor substrate 274, the incident angle 276 is at about the Brewster angle (~72 degrees, for example), such that the polarization direction 278 of the laser is substantially parallel to the surface of the semiconductor substrate 274. A portion of the semiconductor substrate 274 is zoomed out and is numbered as 280. The experiments reveal that the thermal annealing effect is not only associated with the pattern density but also with the pattern configuration, such as spacing, geometry, and orientation. The real thermal annealing effect has to be evaluated based on the heat transfer and absorption mechanisms including reflection, transmission, and absorption of the laser beam 272 during a laser spike anneal.

Alternatively, other annealing techniques may be implemented during a wafer fabrication. The dummy thermal insertion and thermal simulation model have to be tuned according to a particular annealing technology. For example, a rapid thermal annealing (RTA) may be employed in an annealing process. The RTAs are performed by heating a wafer using lamps, such as halogen lamps. Another alternative annealing technique is flash annealing using a flash lamp. Various annealing techniques are different in terms of radiation beam wavelength and heating mechanism. In one example, the flash annealing has a radiation beam wavelength at about 510 nm, the RTA has a radiation beam wavelength at about 1000 nm, and the LSA has a radiation beam wavelength at about 10,600 nm. Since their wavelengths, therefore frequencies, are different, the reflection, transmission, and absorption behaviors are different. The thermal effect of a local circuit pattern varies over different annealing technologies. Each material layer has a particular refractive index n and absorption index k relative to a radiation beam of a certain wavelength. The parameters n and k for materials including silicon nitride ($Si_3N_4$), polycrystalline silicon (Poly-Si), silicon oxide ($SiO_2$) and silicon (Si) relative to the flash annealing, RTA, and LSA (laser) are summarized in table 290 of FIG. 5. Generally, the thermal simulation includes simulating an annealing radiation beam, during an annealing process, of its reflection, transmission, and absorption by various circuit features including STI (of silicon oxide), substrate (silicon), gate (poly-Si), or gate spacer (silicon nitride) as a few examples. The thermal simulation also includes local temperature change after the absorption of the radiation beam from the annealing process. Alternatively, the thermal simulation model can be simplified into one or more lookup tables generated from optical simulation or direct silicon data based on various test patterns. This approach will be separately described in more detail later.

Figure 6:
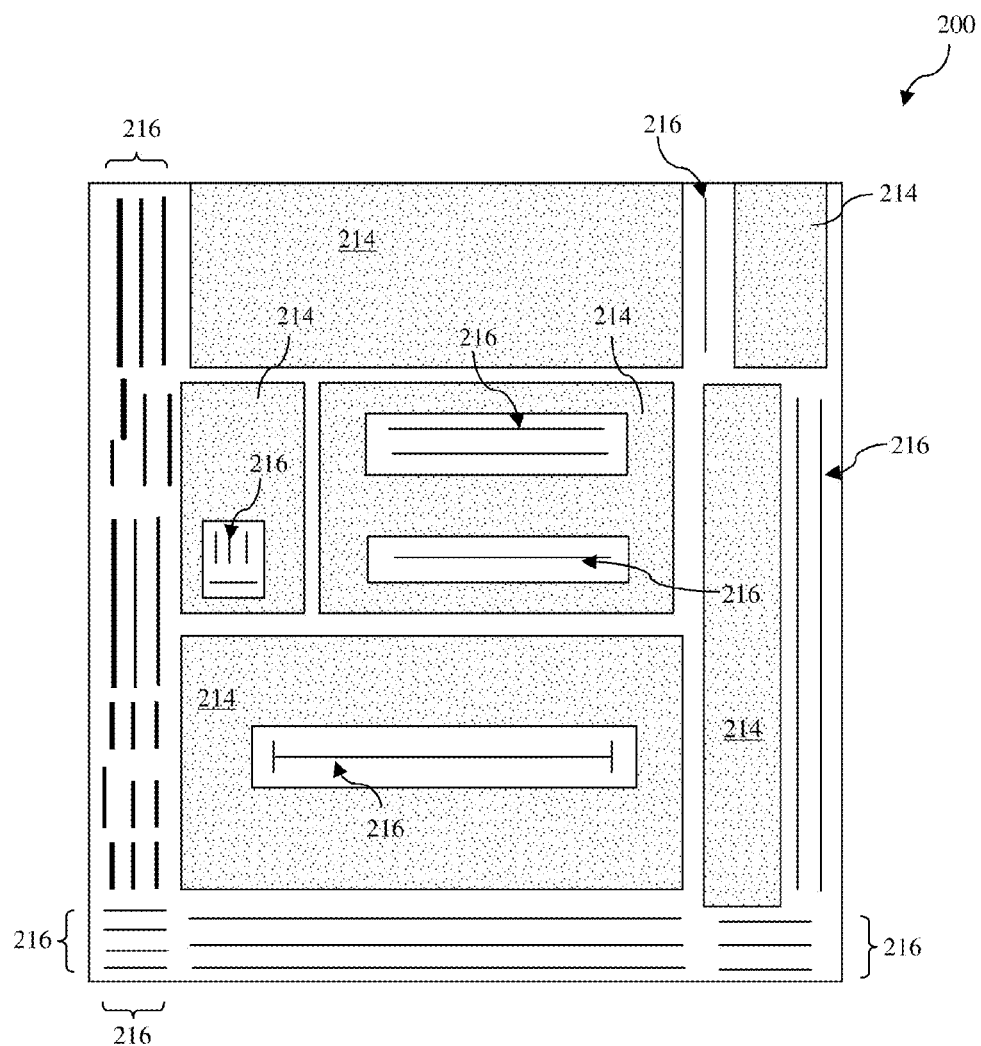
FIG. 6 is a top view of an IC design layout constructed according to aspects of the present disclosure in another embodiment.

Various dummy thermal features are added to the IC design layout 200 at steps 112, as illustrated in FIG. 6. These dummy thermal features are added to the dummy regions 216 and are referred to as 216 as well for simplicity. As described above, the dummy thermal feature can be designed to have any proper shape, size, location, and configuration for optimized thermal uniformity. The insertion of the dummy thermal features can be implemented after and/or before the simulation of the thermal effect of the main circuits in the IC design layout. In one embodiment, the insertion of the dummy thermal features and the simulation of the thermal effect of the IC design layout can be repeated for more than one cycle until the thermal uniformity is within a tolerable range. In this case, the simulation of the IC design layout may include both the main circuit and the inserted dummy thermal features. The insertion of the dummy thermal features after the first cycle includes adding additional dummy thermal features and/or modifying the inserted dummy thermal features. Modifying the inserted dummy thermal features includes resizing, relocating, and/or reshaping the inserted dummy thermal features in various examples. The insertion of the dummy thermal features may further include modifying the main circuit features by resizing, relocating and/or reshaping the main circuit features in various examples.

The method 100 proceeds to step 116 by simulating electrical performance of the main circuit or devices defined in the IC design layout 200 and to be formed in a semiconductor wafer. The electrical performance of the main circuit (or devices) is simulated and evaluated based on the simulation of the thermal effect. In the semiconductor fabrication, an annealing process is usually applied to a semiconductor wafer to reduce defects and activate doped species after an ion implantation, such as a lightly doped drain (LDD) ion implantation or a channel ion implantation to adjust the corresponding threshold voltage. The real electrical effect of the annealing process to a doped region depends on the thermal effect (such as thermal profile: temperature over time) of the annealing process to the doped region. The electrical performance of the device associated with the doped region depends on the redistribution of the doped species. Therefore, the electrical performance of the circuit (devices) is impacted by the dummy thermal features through the annealing process. The simulation of the electrical performance of the circuit (devices) can be implemented based on a model to correlate between the electrical performance and the IC design layout including the incorporated dummy thermal features. More particularly, the insertion of the dummy thermal features not only tunes the thermal uniformity but also tunes the electrical performance of the circuit/devices. Considering the electrical performance of the circuit/devices is more relevant to the specification and performance of the final product, the insertion of the dummy thermal features can be more effectively evaluated and tuned according to the electrical performance of the circuit/devices. Furthermore, many other processes, such as ion implantation, can contribute to the electrical performance of the circuit/devices, the variation of one process will cause the variation of the electrical performance of the circuit/devices. In this case, the insertion of the dummy thermal features according to the electrical performance not only reduces the thermal uniformity issue but also compensates the variations from other factors/processes, such as ion implantation. The simulation of the electrical performance may include simulating the redistribution of the implanted species. The simulation model includes various relevant parameters/factors, such as diffusion and/or thermal profile. The simulation further generates electrical parameters of a transistor, such as saturation current, threshold voltage, and/or leakage current based on the redistributed implanted species. In one embodiment, the simulation includes a SPICE tool relating the redistributed dopant profile and the electrical parameters, such as threshold voltage. The SPICE tool is a circuit-analysis program developed by UC Berkeley. SPICE is a tool to provide complete physical simulation including output signal deformation, signal level, and time delay. Other alternative tools include ASTAP developed by IBM. In building such a simulation model, various silicon data (bench test results) are collected and used to verify if the simulation is correct.

The method 100 proceeds to 118 to check if the simulation result is acceptable in terms of one or more electrical parameters. In one embodiment, the threshold voltage is used as such parameter. If the threshold voltage of a transistor generated from the electrical performance simulation is within a predefined range, such as a tolerable range defined in the specification of the product, then the modified IC design is acceptable. Otherwise, the method 100 returns to step 112 to repeat the procedure including the thermal dummy insertion at step 112, thermal effect simulation at step 114, and electrical performance simulation at step 116 until the IC design layout is acceptable. The thermal dummy insertion includes adding dummy thermal features, resizing, reshaping, and relocating the previously added dummy thermal features.

The procedure of the steps 112, 114, 116, and 118 can be applied to a circuit feature, a group of circuit features, a device (such as a transistor), a circuit block, or a region of a predefined area of the IC design layout. Then the procedure of the steps 112, 114, 116, and 118 may be repeated to some or each of the other circuit features, groups of circuit features, devices, circuit blocks, or regions of the IC design layout. In the above procedure, the step 112 may be implemented in a different sequence relative to the other steps. In one embodiment, the insertion of the dummy thermal features is performed prior to the thermal effect simulation at step 114 and the electrical performance simulation at step 116. In furtherance of the embodiment, the insertion of the dummy thermal features may be implemented based on a lookup table that is built up according to various test patterns. Alternatively, the insertion of the dummy thermal features is performed after the thermal effect simulation at step 114 and the electrical performance simulation at step 116.

Other dummy features, such as dummy CMP features for CMP uniformity and OPC assist features for resolution enhancement, may be added to the IC design layout before or after the insertion of the dummy thermal features. Alternatively, the other dummy insertion may be collectively implemented with the insertion of the dummy thermal features. For example, the OPC assist features and CMP dummy features are added, then the dummy thermal features are added to the IC design layout, and then the thermal effect is simulated and evaluated. The electrical performance is simulated and evaluated thereafter. The step 112 for the insertion of the dummy thermal features is repeated such that dummy thermal features are tuned to enhance the thermal uniformity. In another embodiment, the thermal effect is simulated after the OPC assist features and dummy CMP features have been added to the IC design layout. Thereafter, the dummy thermal features are added to the IC design layout. The electrical performance is further simulated. The dummy thermal features are modified by adding, reshaping, resizing, and/or repositioning for optimized electrical performance. In various embodiments, the insertion of the dummy thermal features, the insertion of the OPC assist features, the insertion of the dummy CMP features, the thermal effect simulation, and the electrical performance simulation can be implemented in any proper sequence and can be iterated or partially iterated until the thermal effect is optimized or the electrical performance is improved to a tolerable range predefined according to the product specification. For another example, OPC assist features may be added to one material layer (such as a polysilicon gate layer) while the dummy thermal features are added to another material layer (such as a silicon substrate). The two steps may have no interference and can be independently implemented. In another embodiment, the CMP assist features may be added in a material layer (such as metal layer or polysilicon gate layer) while the dummy thermal features are added to another material layer (such as a silicon substrate). The two steps can be independently implemented without interference.

After the completion of the procedure for the dummy thermal features insertion including steps 112, 114, 116, and 118, the provided IC design layout at step 110 is converted to a modified IC design layout for mask fabrication. The method 100 proceeds to step 120 by fabricating one or more photomasks (masks) according to the modified IC design layout. The mask may utilize various technologies, including a binary mask having a transparent substrate (such as fused quartz) and an opaque material layer (such as chromium) coated thereon, and patterned according to the IC design layout; phase shift mask (PSM), such as alternative phase shift mask; attenuated phase shift mask; or chrome-less phase shift mask. The mask fabrication may involve electron beam writing or alternatively other techniques, such as ion beam writing or x-ray writing.

The method 100 proceeds to step 122 by making one or more semiconductor wafers (such as silicon wafers) using the fabricated mask(s). For example, a material layer (such as a polysilicon layer, the silicon substrate, or a dielectric material layer) is patterned by a photolithography process using the mask(s). In one particular example, the mask includes the modified IC design pattern having STI features and dummy STI thermal features for thermal effect. A photolithography process is applied to a photoresist layer coated on a wafer, patterning the photoresist layer using the mask and forming a patterned photoresist layer having various openings that define STI regions. The silicon substrate is etched through the openings of the photoresist layer to form trenches. The trenches are further filled with dielectric material(s) to form STI features and dummy STI thermal features (collectively referred to as STI features below) in the silicon substrate.

In one embodiment, the STI features can be formed by a procedure including etching the substrate for trenches, filling the trenches with a dielectric material, and then applying a planarizing process to the substrate to remove the excess dielectric material from the substrate. In one embodiment, the shallow trench isolation features include silicon oxide. The silicon oxide can be filled in the trenches by a CVD process. In various examples, the silicon oxide can be formed by a high density plasma chemical vapor deposition (HDPCVD). The silicon oxide may be alternatively formed by a high aspect ratio process (HARP). In another embodiment, the trench isolation features may include a multi-layer structure. In furtherance of the embodiment, the STI features include other suitable materials, such as silicon nitride, silicon oxynitride, low-k materials, air gap, or combinations thereof. For example, the isolation features include a thermal oxide lining layer to improve the trench interface. In another example, the trenches are filled with a thermal silicon oxide lining layer and a HDPCVD silicon oxide layer. In another example, the trenches may have a multi-layer structure with a thermal oxide liner layer, a CVD silicon nitride layer, and a CVD silicon oxide layer. In one embodiment, the planarizing process includes a chemical mechanical polishing (CMP) process applied to the semiconductor substrate to remove excessive portions of the trench-filling dielectric material. As one example, the CMP process can use a silicon nitride layer as a polishing stop layer so that the CMP process can properly stop at the silicon nitride layer. An annealing process may be further applied to the trench isolation features formed in the silicon substrate.

Other subsequent processes include ion implantation and a follow-up annealing process. In one example, lightly doped drain (LDD) features are formed in the silicon substrate by an ion implantation process. An annealing process (such as a laser spike annealing, RTA, or a flash annealing) is applied to the silicon substrate after the LDD implantation to reduce defects and activate the implanted species. In one embodiment, since the STI features also incorporate dummy thermal features therein, the annealing process is optimized to have uniform thermal effect. The thermal effect variation from location to location of the wafer is minimized or reduced. Furthermore, the electrical performance of the circuit and the devices (such as transistors) of the circuit is optimized to meet the specification of the product in some embodiments. More particularly, the dummy STI thermal features incorporated into the IC design and formed in the semiconductor wafer are specifically designed for the annealing process according the respective annealing technique (RTA, flash, or LSA) and may be further tuned according to various parameters of the corresponding annealing process.

Figure 7:
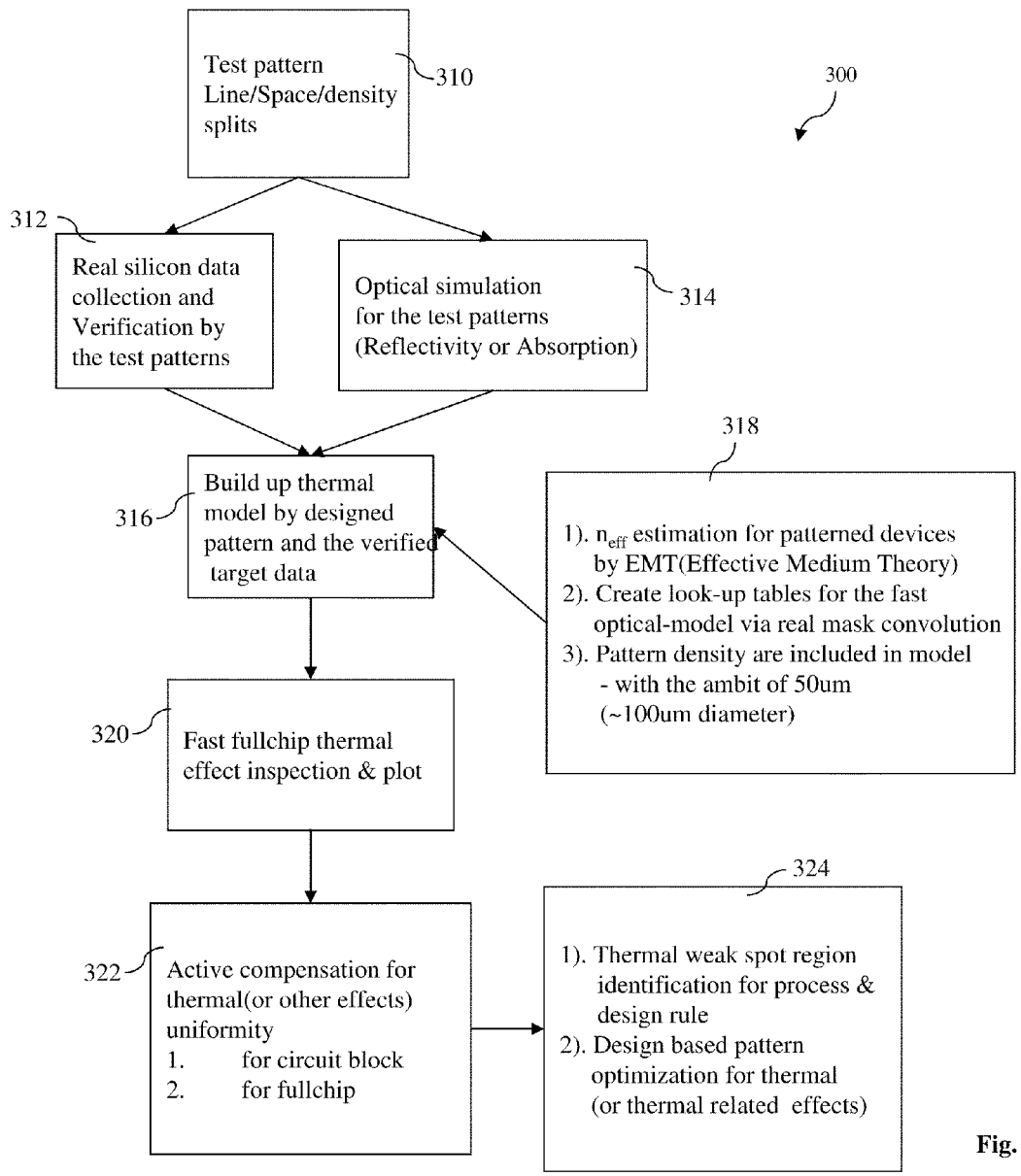
FIG. 7 is a flowchart of an IC design method constructed according to aspects of the present disclosure in another embodiment.

FIG. 7 is a flowchart of an IC design method 300 constructed according to various aspects of the present disclosure. The method 300 begins at step 310 by providing various test patterns. The test patterns are designed to have respective configurations and dimensions to cover various representative configurations and dimensions. In one embodiment, the dummy thermal features are dummy isolation features (such as dummy STI thermal features) to be incorporated into an IC design layout for isolation features (STI). Particularly, the thermal effect of an annealing process is more sensitive to the STI features since the STI features are in the semiconductor layer where the implanted species reside and the STI features behave differently than the surrounding silicon substrate in terms of thermal effect. In one embodiment, each test pattern has a particular configuration, line width, line spacing, and pattern density.

Figure 8:
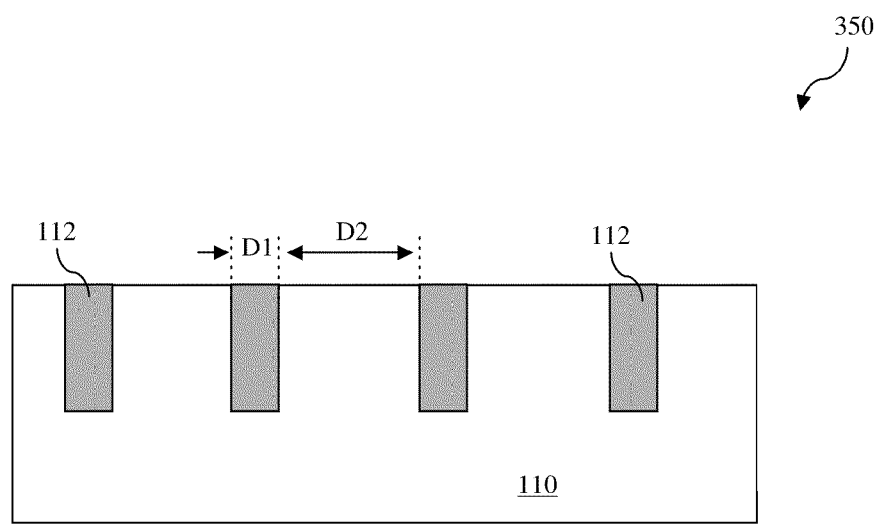
FIG. 8 is a sectional view of a test structure constructed according to aspects of the present disclosure.

As one embodiment, a semiconductor structure 350 having a test pattern is illustrated in a sectional view in FIG. 8. The semiconductor structure 350 includes a semiconductor substrate 110, such as a silicon wafer, and shallow trench isolation (STI) features 112 formed in the semiconductor substrate. The STI features are configured to have a periodic configuration. The semiconductor regions between the adjacent STI features are referred to as active regions for forming various doped features and semiconductor devices. As illustrated in FIG. 8, "D1" defines a dimension (or width) of the STI features while "D2" defines a dimension (or width) of the active regions. The dimension D1+D2 is defined as a pitch of the periodic STI features. A duty ratio is defined as D2/D1 for STI occupancy density.

The method 300 proceeds to step 312 by collecting silicon data from various test patterns. In one embodiment, various test patterns having a same configuration but different pitches and duty ratios are physically fabricated on one or more semiconductor substrates, a thermal annealing process is applied to the test patterns to collect real experimental data (or silicon data) from the semiconductor substrates. In another embodiment, an annealing process of each technique (RTA, flash, or LSA) is respectively applied to the test patterns to collect real experimental data.

Figures 9A, 9B, 9C:
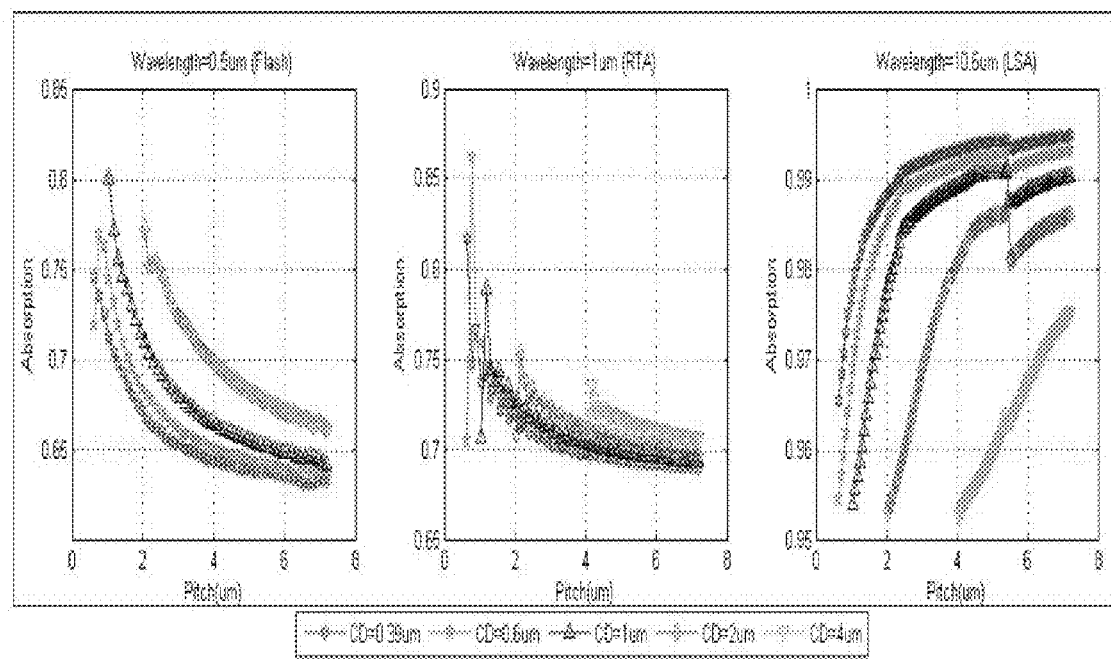
FIGS. 9a through 9c provide charts of experimental data collected from various test semiconductor structures of FIG. 8.

FIGS. 9a through 9c provide exemplary graphs with silicon data. The experimental data are plotted in the graphs with the horizontal axis defined as pitch and the vertical axis defined as light absorption. Each graph includes five curves plotted according to the experimental data. Each curve is associated with a STI structure of a particular width D1 (labeled as "CD" in the legend). FIG. 9a is a graph for the experimental data from the flash annealing process (radiation wavelength=0.5 micron). The graph includes five curves corresponding to D1 as 0.39 micron, 0.6 micron, 1 micron, 2 microns, and 4 microns, respectively, from the bottom curve to the top curve. The curve to D1=2 microns and the curve to D1=4 microns almost fall to one curve. FIG. 9b is a graph for the experimental data from the RTA process. Similarly, the graph in FIG. 9b includes five curves corresponding to D1 as 0.39 micron, 0.6 micron, 1 micron, 2 microns, and 4 microns, respectively, from the bottom curve to the top curve. FIG. 9c is a graph for the experimental data from the LSA process (radiation wavelength=10.6 microns). The graph in FIG. 9c includes five curves corresponding to D1 as 0.39 micron, 0.6 micron, 1 micron, 2 microns, and 4 microns, respectively, from the top curve to the bottom curve. The experimental data and curves in FIGS. 9a through 9c clearly demonstrate that each annealing process has its particular absorption characteristic over the STI pitch and STI width D1.

Figure 10:
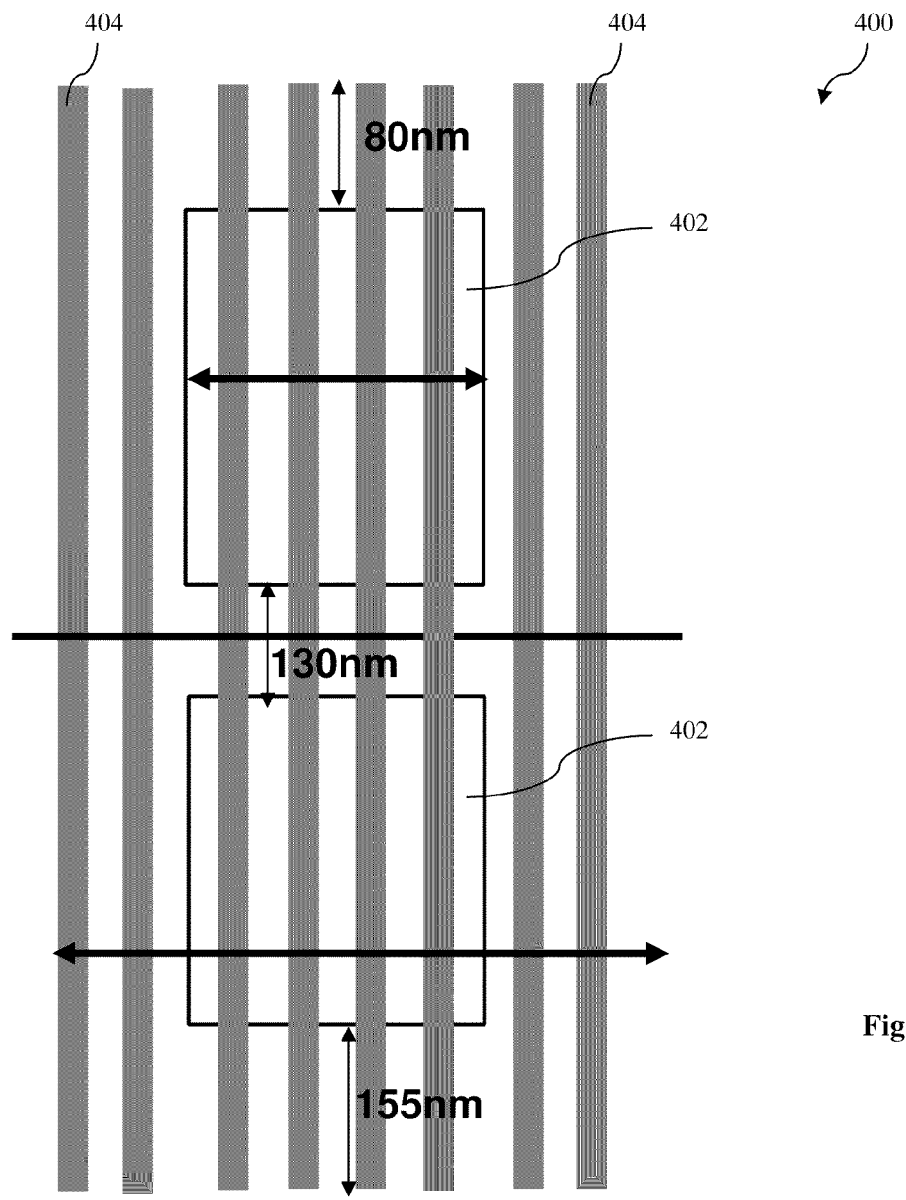
FIG. 10 is a top view of a test structure constructed according to aspects of the present disclosure in one embodiment.

In another embodiment, a test pattern includes STI features and gates as one shown in FIG. 3b. The various gates are formed on the semiconductor substrate and a subset of the gates are disposed overlying the STI features. FIG. 10 illustrates one embodiment of such a test structure 400 in a top view. The test pattern 400 includes active regions 402 surrounded by STI features in a semiconductor substrate. The test pattern 400 also includes gates 404 disposed on the semiconductor substrate. Some gates are partially overlying the STI features while the other gates are directly disposed on the semiconductor substrate. Such configured test structures are designed and fabricated with various parameters. For example, the pitch of the STI features is 2 microns or greater. The duty ratio of the STI features is 1 or greater. The STI width D1 is 1 micron or greater. In one exemplary configuration, various dimensions between adjacent STI features or between the gate array and the STI features are illustrated and labeled in FIG. 10.

Figure 11A:
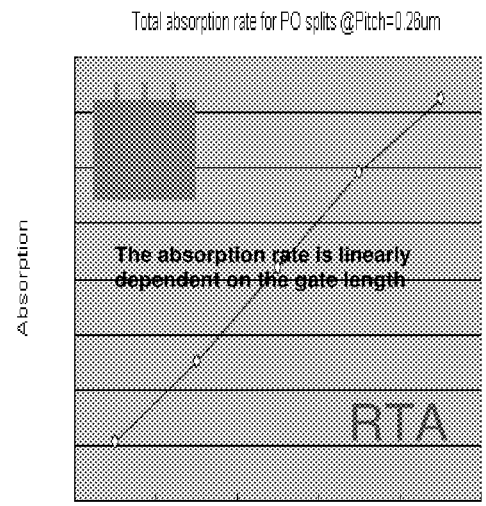
FIGS. 11a through 11d provide various experimental data collected from the various test structures of FIG. 10 in various embodiments.
Figure 11B:
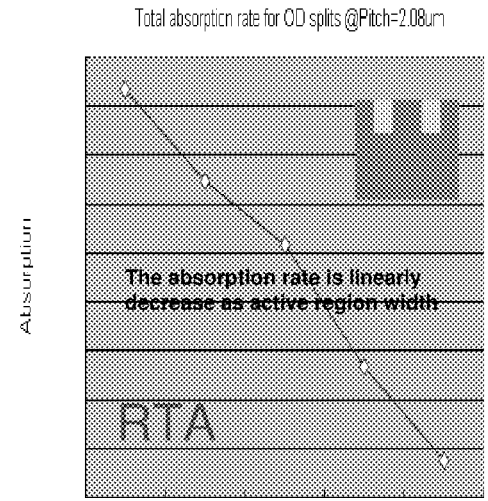
Figure 11C:
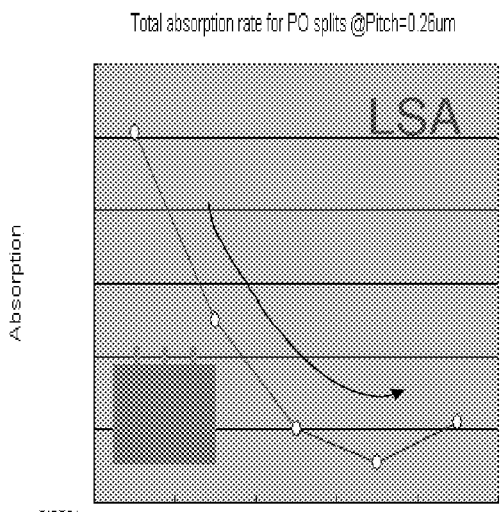
Figure 11D:
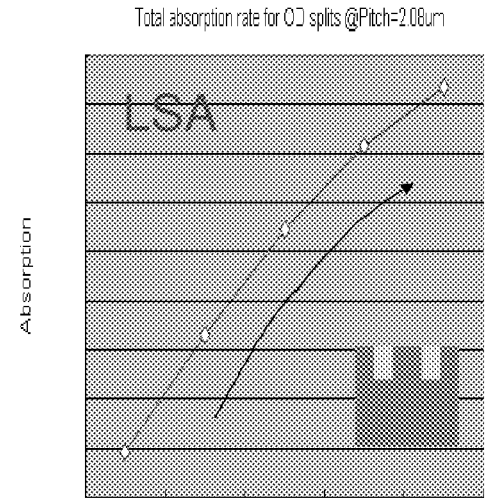

FIGS. 11a through 11d provide experimental data from various test patterns. FIG. 11a includes experimental data for test patterns having periodic gate arrays. The gate pitch is 0.26 micron. The data are absorption versus gate length. FIG. 11b includes experimental data for test patterns having periodic STI features. The STI pitch is 2.08 microns. The data are absorption versus active region width. The data in FIGS. 11a and 11b are collected from the RTA process. FIG. 11a indicates that absorption linearly increases over the gate length. FIG. 11b indicates that absorption linearly decreases over the active region width. FIG. 11c includes experimental data for test patterns having periodic gate arrays. The gate pitch is 0.26 micron. The data are absorption versus gate length. FIG. 11d includes experimental data for test patterns having periodic STI features. The STI pitch is 2.08 microns. The data are absorption versus active region width. The data in FIGS. 11c and 11d are collected from the LSA process. FIG. 11c indicates that absorption decreases over the gate length. FIG. 11d indicates that absorption increases over the active region width.

Alternatively, the method may proceed to step 314 by collecting data (e.g., reflection or absorption) through optical simulation. The simulation may implement a model to quantitatively describe the reflection and/or absorption of the radiation beam used in the corresponding annealing process (such as RTA, flash, or LSA). The simulation step 314 may use various test patterns similar to the test patterns used at step 312.

The method 300 then proceeds to step 316 by building up a thermal model based on the silicon data collected at step 312 or simulation data extracted at step 314. The thermal model includes various test patterns, such as those illustrated above, and the corresponding experimental data, such as the absorption data. In the thermal model built from the simulated data, it may be further verified and tuned through silicon data. In one embodiment, any IC design configuration can be mapped to one of the test patterns in the thermal model. The thermal effect, such as the absorption, can be directly extracted from the experimental data of the mapped test pattern, or interpolated from the test patterns having close geometrical parameters. Furthermore, the thermal model further includes various data or a subset thereof provided at the block 318. In one embodiment, the thermal model includes the estimation of the effective refractive index neff for the test patterns (or patterned devices) by effective medium theory (EMT). EMT is a physical model that describes the macroscopic properties of a medium based on properties and relative fractions of its components. The EMT provides an approach to calculate effective properties of media, such as reflection and/or absorption. In another embodiment, one or more lookup tables are created, as an efficient optical model, via real mask convolution. For example, for a targeted thermal effect, the lookup table(s) can be used to extract the corresponding configuration having the targeted thermal effect. Thus, the current IC design features are modified according to the corresponding configuration of the IC design layout to achieve the targeted thermal effect. In another embodiment, the thermal model includes pattern densities and the corresponding thermal effect. In one example, the pattern densities are provided in a local region with a diameter of about 100 microns. In the furtherance of the embodiment, the pattern densities are associated with the absorptions and formatted in a lookup table for easy extraction. For example, when an absorption is targeted for the optimized device performance, the corresponding pattern density can be extracted from the lookup table based on the targeted absorption. The IC design layout is modified based on the corresponding pattern density.

The method 300 may proceed to step 320 by performing a thermal inspection and plotting. In one embodiment, the thermal inspection is a full-chip process and is designed to evaluate the thermal uniformity.

The method 300 may proceed to step 322 by performing an active compensation for the thermal uniformity and/or other thermal effects. The compensation includes modifying the IC design layout, including resizing, reshaping, repositioning, and adding dummy thermal features. The compensation is performed by implementing the thermal model such as extracting the targeted parameters from the lookup tables built at step 316. The compensation process is applied to a circuit block or alternatively the full wafer. In one embodiment, the current IC design features are modified according to the corresponding configuration of the relevant test pattern to achieve the targeted thermal effect. In another embodiment, the IC design layout is modified based on the corresponding pattern density by adding dummy thermal features and/or tuning the existing IC design features (e.g., reshaping, resizing, and repositioning).

The compensation may include other further actions provided at block 324. Those further actions include identifying weak spot and pattern optimization to the IC design layout. In one embodiment, one or more weak spot regions can be indentified in the IC design layout according to process characteristics and/or design rules. For example, a criteria for real annealing temperature or annealing thermal profile is predefined. When the thermal effect to a portion of the wafer is predicted to be beyond the predefined criteria, the corresponding region of the IC design layout is identified as a weak spot. In another example, the annealing temperature to a portion of the wafer has a deviation from the average annealing temperature more than about 10%, the corresponding region is identified as a weak spot. In another example, if the IC design layout has a region with a pattern density out of specification according to the design rule, wherein the design rule may be extracted from the thermal model or silicon data, then the region is identified as a weak spot. The compensation may be applied to those weak spot regions. In another embodiment, a design based pattern optimization is applied to the IC design layout for thermal effect or other thermal related effects. The pattern optimization may include reorientation of the IC design features, reshaping, resizing, repositioning, and splitting for enhanced thermal effect, or other thermal related effects, such as reflection.

Figure 12:
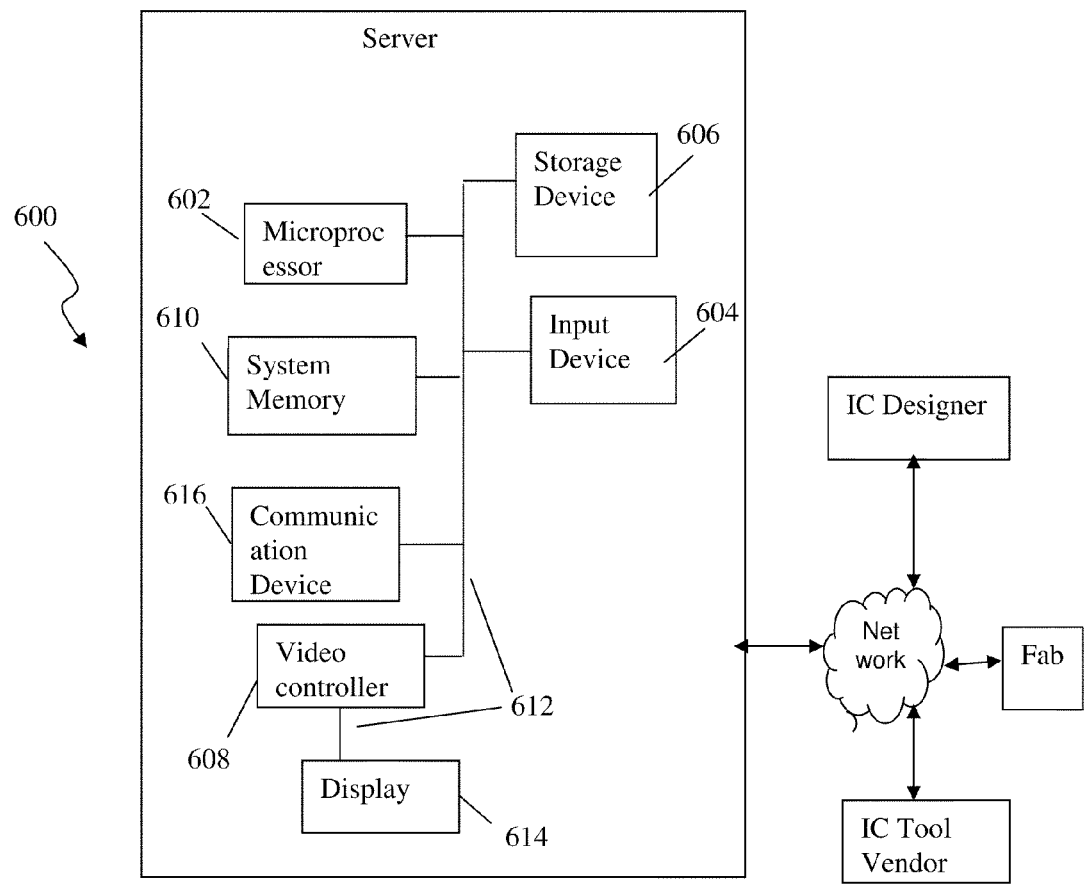
FIG. 12 provides an illustrative computer system for implementing embodiments of the methods in FIG. 1 and FIG. 7.

Referring now to FIG. 12, shown therein is an illustrative computer system 600 for implementing embodiments of the methods described above, such as the method 100 of FIG. 1 and/or the method 300 of FIG. 7. The computer system 600 is shown as including four separate computer systems, a server, an IC tool vendor, an IC designer, and a fab, connected over one or more networks. This is just an example, and various configurations of more or less computer systems connected over more or less networks can alternatively be used, according to the desired embodiment configuration.

For the sake of further example, each computer system includes a microprocessor 602, an input device 604, a storage device 606, a video controller 608, a system memory 610, a display 614, and a communication device 616 all interconnected by one or more buses 612. The storage device 606 could be a floppy drive, hard drive, CD-ROM, optical drive, flash memory, or any other form of storage device. In addition, the storage device 606 may be capable of receiving a floppy disk, CD-ROM, DVD-ROM, or any other form of computer-readable medium that may contain computer-executable instructions. Further, communication device 616 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage, such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server and run on a separate platform. Further, the database may be accessible across the Internet. Note that more than one database may be implemented.

Although embodiments of the present disclosure have been described in detail, those skilled in the art should understand that they may make various changes, substitutions, and alterations herein without departing from the spirit and scope of the present disclosure. For example, the thermal annealing process is not limited to the laser spike annealing, RTA, and flash annealing, it may include other annealing processes applicable to a semiconductor wafer. The thermal model and simulation are associated with the corresponding annealing process so the modified IC design layout is tuned such that a thus patterned wafer has an optimized thermal effect during the corresponding annealing process.

Thus, the present disclosure provides an integrated circuit method. The method includes providing an integrated circuit (IC) design layout; simulating thermal effect to the IC design layout; simulating electrical performance to the IC design layout based on the simulating thermal effect; performing thermal dummy insertion to the IC design layout based on the simulating electrical performance; and thereafter fabricating a mask based on the IC design layout.

The present disclosure also includes another embodiment of an integrated circuit method. The method includes providing a plurality of test patterns; collecting thermal data of the test patterns; building up a thermal model based on the thermal data; adding thermal dummy features to an integrated circuit (IC) design using the thermal model; and making a mask according to the IC design.

The present disclosure also includes another embodiment of an integrated circuit method. The method includes providing a plurality of test patterns; collecting thermal data of the test patterns; creating a look-up table based on the thermal data; evaluating thermal effect to an integrated circuit (IC) design; adding thermal dummy features to the IC design using the look-up table; and thereafter making a mask according to the IC design.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit method, comprising:
    receiving an integrated circuit (IC) design layout into the computer system;
    simulating thermal effect to the IC design layout on the computer system;
    simulating electrical performance to the IC design layout based on the simulated thermal effect on the computer system; and
    performing thermal dummy insertion to the IC design layout based on the simulated electrical performance, wherein performing thermal dummy insertion to the IC design layout includes adding thermal dummy features to the IC design layout using a look up table based on thermal data.

2. The method of claim 1, further comprising fabricating a mask based on the IC design layout after the performing thermal dummy insertion.

3. The method of claim 2, further comprising fabricating a wafer using the mask.

4. The method of claim 1, further comprising repeating the simulating thermal effect, the simulating electrical performance, and the performing thermal dummy insertion before the fabricating the mask.

5. The method of claim 4, wherein the repeating thermal dummy insertion includes at least one of adding, resizing, repositioning, and reshaping a thermal dummy feature.

6. The method of claim 1, wherein the simulating thermal effect includes simulating reflection, transmission, and absorption of a radiation beam during an annealing process.

7. The method of claim 1, wherein the simulating electrical performance includes simulating an ion implantation process.

8. The method of claim 1, wherein the simulating electrical performance includes extracting at least one of saturation current and threshold voltage.

9. The method of claim 1, wherein the simulating thermal effect to the IC design layout includes simulating the thermal effect to the IC design layout using a thermal model and further includes:
    providing test patterns each with respective line width, line spacing, and line density;

collecting the thermal data from the test patterns; and building up a thermal model according to the thermal data.

10. The method of claim 1, wherein the thermal data is collected from test patterns.

11. A method, comprising:
receiving a plurality of test patterns;
collecting thermal data of the test patterns;
building up a thermal model based on the thermal data;
performing electrical simulations of the test patterns; and
adding thermal dummy features to an integrated circuit (IC) design using the thermal model and the simulations,
providing the IC design with the thermal dummy features to a mask making facility for making a mask according to the IC design,
wherein the building up a thermal model includes creating a look-up table, and the adding thermal dummy features includes adding the thermal dummy features using the look-up table.

12. The method of claim 11, wherein the adding thermal dummy features to the IC design further includes:
simulating thermal effect of the IC design using the thermal model; and
simulating electrical performance of the IC design based on the simulating thermal effect.

13. The method of claim 11, further comprising making a mask using the IC design.

14. The method of claim 11, wherein each of the test patterns includes a plurality of line features with respective line width, line spacing, and line density.

15. The method of claim 11, wherein each of the test patterns includes a respective duty ratio.

16. The method of claim 11, wherein the providing a plurality of test patterns includes fabricating the plurality of test patterns on at least one wafer; and the collecting thermal data includes collecting the thermal data from the at least one wafer.

17. The method of claim 14, wherein the test patterns includes shallow trench isolation (STI) features.

18. The method of claim 11, wherein the collecting thermal data includes simulating the test patterns based on a thermal annealing process selected from a flash annealing process, a rapid thermal annealing (RTA) process, and a laser spike annealing (LSA) process.

19. The method of claim 11, wherein the adding thermal dummy features includes identifying a thermal weak spot on the IC design using the thermal model, and applying thermal dummy insertion to the thermal weak spot of the IC design.

20. An integrated circuit method, comprising:
receiving a plurality of test patterns;
collecting thermal data of the test patterns;
creating a look-up table based on the thermal data;
evaluating thermal effect to an integrated circuit (IC) design;
simulating electrical performance of the IC design based on the evaluated thermal effect;
adding thermal dummy features to the IC design using the look-up table and the simulated electrical performance; and
thereafter making a mask according to the IC design.

* * * * *